United States Patent [19]

Freilich et al.

[11] Patent Number: 4,728,593
[45] Date of Patent: Mar. 1, 1988

[54] PHOTOCONDUCTIVE POLYIMIDE-ELECTRON DONOR CHARGE TRANSFER COMPLEXES

[75] Inventors: Steven C. Freilich; Stephen Mazur, both of Wilmington, Del.

[73] Assignee: E. I. Du Pont de Nemours and Company, Wilmington, Del.

[21] Appl. No.: 870,397

[22] Filed: Jun. 9, 1986

Related U.S. Application Data

[63] Continuation-in-part of Ser. No. 754,809, Jul. 12, 1985, abandoned.

[51] Int. Cl.$^4$ .................. G03G 5/06; G03G 5/07; G03G 5/09
[52] U.S. Cl. ..................... 430/72; 430/73; 430/74; 430/75; 430/78; 430/83; 430/900; 156/434
[58] Field of Search ............ 430/70, 73, 74, 75, 430/76, 78, 83, 900

[56] References Cited

U.S. PATENT DOCUMENTS

| | | | |
|---|---|---|---|
| 3,163,531 | 12/1964 | Schlesinger | 430/78 X |
| 3,314,788 | 4/1967 | Mattor | 430/73 X |
| 3,615,404 | 10/1971 | Price et al. | 430/73 X |
| 3,767,393 | 10/1973 | Fox | 430/73 X |
| 3,784,376 | 1/1974 | Fox | 430/78 |
| 4,363,860 | 12/1982 | Van Turnhout et al. | 430/900 X |

FOREIGN PATENT DOCUMENTS

| | | |
|---|---|---|
| 248402 | 8/1960 | Australia. |
| 57-45548 | 3/1982 | Japan. |
| 1150435 | 4/1969 | United Kingdom. |

OTHER PUBLICATIONS

Ryszard Gawinecki et al., "Electron Absorption Spectra of Aromatic Schiff Bases, Part III*. p--Phenylenediamine Derivatives", Polish J. Chem., 55: 565 (1981).

*Primary Examiner*—Roland E. Martin
*Attorney, Agent, or Firm*—James A. Costello

[57] ABSTRACT

Polyimide-electron donor charge transfer complexes, supported or unsupported, as photoconductive elements characterized by photoconductivities in excess of the sum of the individual photoconductivities of the polyimide and electron donor components.

22 Claims, No Drawings

PHOTOCONDUCTIVE POLYIMIDE-ELECTRON DONOR CHARGE TRANSFER COMPLEXES

CROSS-REFERENCE TO RELATED APPLICATION

This is a continuation-in-part of copending application bearing U.S. Serial No. 754,809 filed on July 12, 1985, now abandoned.

BACKGROUND OF THE INVENTION

The present invention relates generally to organic photoconductive materials and electrostatic imaging processes, and particularly to improvements in photoconductive polyimide films through formation of polyimide-electron donor charge transfer complexes.

Materials which behave as insulators in darkness but conduct electricity when illuminated or irradiated are known as photoconductive materials, or more commonly, as photoconductors. Such materials provide the basis for electrostatic imaging processes, which are used in certain manufacturing processes, particularly in the electronics industry, and in document copying.

Use of polyimides as photoconductive elements is disclosed in U.S. Pat. No. 3,554,744. However, formation of polyimide-electron donor charge transfer complexes to enhance photoresponse is not disclosed. U.S. Pat. No. 4,368,319 discloses selected polyimide species incorporating aliphatic groups comprising "electron donors", which are defined to be heteroatoms such as oxygen or sulfur, or nitrogen-containing radicals. Treatment of polyimides to form polyimideelectron donor charge transfer complexes is not disclosed.

Gordina, et al., *Visokomolekulvarnie soedineniya (B)*15:378 (1973) disclose that aromatic polyimides are intrinsic donor-acceptor materials and that they form charge transfer complexes with added electron acceptors.

British Pat. No. 1,150,435 discloses addition of certain electron donors to a number of so-called "organic binders". Polyimides are included in the list of binders. The patent does not disclose the electron donors employed in the instant invention, nor does it appear that patentees formed or could have formed charge transfer complexes. The electron donors are described as photoconductors and patentees add them to a binder to impart donor photoconductivity to the binder.

U.S. Pat. No. 4,363,860 discloses addition of the acid acceptor, trinitrofluorenone, to polyamic acid followed by imidization.

SUMMARY OF THE INVENTION

This invention concerns a photoconductive element comprising a polyimide-electron donor charge transfer complex characterized in that the donor molecules are, themselves, not photoconductors in the visible light region and have an ionization potential of about 6 to 9 electron volts (eV). The photoconductive element is characterized in that it (i) is photoconductive in the visible light region, and (ii) has photoconductivity in excess of the sum of the photoconductivities of the polyimide and donor, individually. In fact, the photoconductivities of preferred complexes exceed the sum of the photoconductivities of the polyimide and electron donor components, individually, by at least 50 percent. This enhancement is described in more detail in connection with Table 2 presented hereafter.

Especially preferred photoconductive elements are those wherein the polyimide is a condensation product of pyromellitic dianhydride and oxydianiline (bis(4-aminophenyl)ether) which will hereafter be referred to as PMDA-ODA. These especially preferred elements will have electron donor components with ionization potentials of about 6.7 to 7.8 eV.

Contemplated electron donors are those selected from the groups:

I. aniline and substituted anilines of the formula

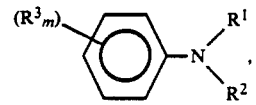

II. tetrathiafulvalene and derivatives of the formula

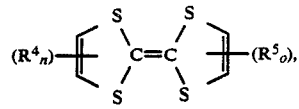

III. 2,3-substituted indole compounds of the formula

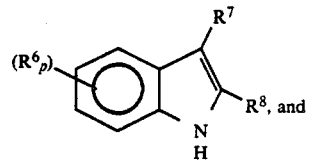

IV. substituted phenylenediamine compounds of the formula

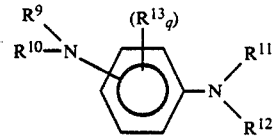

wherein
$R^1$ through $R^{13}$ are independently selected from the group consisting of hydrogen, $C_1$ to $C_{20}$ alkyl, $C_1$ to $C_{20}$ alkoxy, $C_6$ to $C_{12}$ aryl, and $C_7$ to $C_{15}$ alkaryl and aralkyl;
m is an integer from 1 to 5;
n and o are 1 or 2;
p is an integer from 1 to 4; and
q is an integer from 1 to 4.

Preferred donors are those wherein $R^1$ through $R^{13}$ are independently selected from hydrogen, $C_1$ to $C_4$ alkyl and alkoxy, $C_6$ to $C_{12}$ aryl and $C_7$ to $C_{15}$ alkaryl and aralkyl. Examples of preferred alkyl groups or radicals are methyl, ethyl, n-propyl, isopropyl, n-butyl, isobutyl and tert-butyl. Examples of aryl radicals include phenyl and naphthyl, Aralkyl groups include benzyl, 2-phenylethyl, and 3-phenylbutyl. Examples of alkaryl groups include tolyl, ethylphenyl, methylphenyl, and xylyl.

The most preferred donor compound of Formula I is N,N-dimethylaniline (DMA) ($R^1$, $R^2=CH_3$, $R^3=H$), which exhibits an ionization potential of approximately 7.1 eV. Of electron donor compounds defined by Formula II, the compound wherein $R^4$ and $R^5$ are hydrogen is preferred. This compound is tetrathiafulvalene (TTF), which exhibits an ionization potential of approximately 6.9 eV. Of electron donor compounds defined by Formula III, those where $R^7$ and $R^8$ are independently hydrogen or methyl and $R^6$ is hydrogen are preferred. The most preferred donor compound of Formula III is 2,3-dimethylindole (DMI) ($R^7$, $R^8$=CH$_3$; $R^6$=H), which exhibits an ionization potential of approximately 7.8 eV. Of electron donor compounds defined by Formula IV, those wherein $R^9$, $R^{10}$, $R^{11}$, and $R^{12}$ are independently hydrogen, methyl, or ethyl and $R^{13}$ is hydrogen are preferred. The most preferred donor compound of Formula IV is N,N,N',N'-tetramethyl-1,4-phenylenediamine (TMPD) ($R^9$, $R^{10}$, $R^{11}$, $R^{12}$=CH$_3$, $R^{13}$=H), which exhibits an ionization potential of approximately 6.7 eV.

As used herein, the term "alkyl" means a linear, branched-chain, or cyclic aliphatic radical, which can be saturated or unsaturated; "alkoxy" means an alkyl radical joined to another moiety by an oxygen atom; "aryl" means an aromatic radical, for example, phenyl; "aralkyl" means a linear or branched-chain aliphatic radical comprising an aryl group or groups; and "alkaryl" means an aryl radical having one or more aliphatic substituents.

The present invention provides a process for image reproduction comprising exposing a photoconductive element to form a latent image and developing the latent image. By "photoconductive element" is meant a supported or unsupported polyimide-electron donor charge transfer complex. The process of this invention is useful, for example, in fabrication of printed circuitry and for photodetection. The photoconductive elements of this invention display good thermal stability and solvent insensitivity.

DETAILS OF THE INVENTION

As employed throughout the specification, the term "polyimide" refers to a linear polymerized condensation product of diamines and at least one tetracarboxylic acid moiety in which the condensation product has the repeating unit

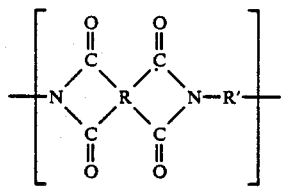

wherein R is an organic tetravalent radical containing at least two carbon atoms, said tetravalent radical being bonded to four carbonyl groups, no more than two carbonyl groups being bonded to any one carbon atom of said tetravalent radical, and R' is an organic divalent radical containing at least two carbon atoms, said divalent radical being bonded to two nitrogen atoms, the nitrogen atoms being attached to different carbon atoms of the divalent radical, where either R, R', or both R and R' contain at least one six-carbon ring characterized by benzenoid unsaturation. Preferably, both R and R' are aryl moieties. Polyimides as thus described generally have an inherent viscosity of at least 0.1 measured as a 0.5% solution in concentrated sulfuric acid at 30° C.

As used herein, the term "polyimide" also comprehends copolyimide polymers wherein more than one different amine or more than one different tetracarboxylic acid or mixtures of different amines and different tetracarboxylic acids are reacted together. Methods for producing polyimides are described in detail in U.S. Pat. Nos. 2,710,853, 3,179,633, and 3,179,634, the disclosures of which are incorporated by reference herein. Also incorporated by reference are the disclosures of parent application Ser. No. 754,809.

Polyimide layers or strata employed in preparing photoconductive elements in accordance with the present invention can be in the form of self-supporting films or layers coated upon suitable support materials. Such layers are then treated with electron donor compounds by contact with a solution containing a donor compound or compounds. A convenient method for complex formation is simply to immerse the polyimide layer in a solution containing donor compound, followed by washing and drying in air.

A listing of donor compounds and corresponding ionization potentials can be found in Franklin et al., "Ionization Potentials, Appearance Potentials, and Heats of Formation of Gaseous Positive Ions," *NBS Standard Reference Data Series #26* (National Bureau of Standards, Washington, D.C., 1969), the disclosure of which is incorporated herein by reference.

Formation of the Charge Transfer Complex

The introduction of small molecule electron donating compounds to polyimides results in formation of a polymeric charge transfer complex of improved optical absorption and electronic properties over the virgin polyimide. It is this charge transfer complex which is responsible for the highly photoconductive elements of this invention. The most notable change in properties of the polyimide upon addition of electron donor is a marked change in coloration of the polymer film. This change in color indicates formation of a charge transfer complex by application of Mulliken theory (R. S. Mulliken, Journ. Am. Chem. Soc., 74, 811 (1952). Studies reveal that the charge transfer complex is formed from electron donation of the added donor molecule to the imide portion of the polymer backbone to form a new species, the charge transfer complex, which is highly electroactive and highly colored.

The photooonductivity of the polymeric charge transfer complex is greater than that of either of the individual species forming the complex, or, in fact, the sum of their individual contributions. The photoconductivity of the polymeric charge transfer complex has its maximum activity at the irradiation energy coincidental with the absorption maximum of the charge transfer complex. This underscores the importance of charge transfer complex formation, and clearly distinguishes elements and process of this invention from prior art elements and processes.

In treating polyimide films or layers with electron donor compounds, the concentration of donor compound in solvent is not critical to the performance of the resulting photoconductive element. Thus, concentrations ranging from 0.01M to 10M in various solvents will provide acceptable results. Appropriate solvents include methylene chloride, chloroform, benzyl alcohol, and meta-cresol. Excellent results can be obtained using 5M solutions of preferred donor compounds in methylene chloride.

Treatment is preferably conducted by immersion of polyimide layers in donor/solvent solutions for periods ranging from 1 to 48 hours. Relatively shorter or longer periods can be employed with acceptable results. Alternatively, the donor compound can be added to a polyamic acid solution. Depending upon the thermal stability of the donor, the polyamio acid solution can be either thermally converted to polyimide, or can be converted by treatment with an appropriate chemical dehydrating agent. The amount of donor added in this manner will range, typically, from about 0.01 to 50 percent by weight; preferably, from 1 to 10 weight percent.

Following complex formation, the complex is removed from contact with the donor-containing solvent, rinsed with methanol or any other solvent in which the donor is soluble, for example cyclohexane or acetone, and allowed to dry.

Table 1, below, indicates representative values for weight percent of donor added to 0.3 mil thick films as a function of treating solution concentration and donor structure. All films were treated in a methylene chloride solution of the donor at the stated concentration for 48 hours at room temperature.

TABLE 1

Weight Percent Donor in PMDA-ODA Film After 48 Hours Immersion at the Given Concentration of Donor

| Donor | Concentration | Weight % |
|---|---|---|
| Dimethylaniline | 1 M | 2.7 |
| Dimethylaniline | 3 M | 6.3 |
| Dimethylaniline | 5 M | 8.4 |
| Tetramethylphenylenediamine | 5 M | 8.9 |
| Tetrathiafulvalvene | 0.5 M | 8.3 |

Measurement of Photoconductivity

To determine photoconductive sensitivity, samples of polyimide-electron donor charge transfer complexes are sandwiched between electrodes and exposed to light. The electrodes employed can be made from conductive metals or conductive glasses, for example, glass coated with tin oxide. For direct measurement, one electrode should be transparent to incident radiation at wavelengths at which the selected donor-polyimide system exhibits absorption. The other electrode is then connected to ground via a microammeter or other device capable of measuring current flow.

After the sample is arranged in contact with the electrodes, a potential is applied across the thickness of the film. Potential fields applied can range from 10 kV/cm and above, to the breakdown limit, or acceptance potential, preferably 1000 kV/cm and above. Optimal results are obtained at the highest applied fields. Polarity can be either positive or negative.

The sample can then be illuminated by exposure to radiation through the glass electrode. The source of illumination can be either visible, UV, or infrared radiation. Visible light is preferred due to availability, and light sources employed can be monochromatic or broad-spectrum. Best results are obtained at high photon fluxes, but good photoconductive response can be obtained at illumination intensities ranging from $10^{-6}$ J/cm$^2$ and greater.

Following application of a potential field of 320 kV/cm and exposure to incident light at a wavelength of 620 nm, PMDA-ODA polyimide films treated with electron donor molecules to form complexes at the concentrations indicated in Table 1 exhibited enhanced photoconductive response. The enhancement obtained by treatment of PMDA-ODA polyimide films (thickness: 7.6 micrometers) with selected donor molecules relative to untreated PMDA-ODA polyimide is indicated in Table 2. In Table 2, enhancement is defined by the ratio of currents measured for treated versus untreated films, taking the steady-state current value obtained after 30 seconds of illumination at about 23°, minus the equilibrium dark current.

TABLE 2

Enhancement of Photoconductivity in Elements of PMDA-ODA-Electron Donor Charge Transfer Complexes

| Donor Molecule | Approximate Ionization Potential (eV) | Enhancement at 620 nm |
|---|---|---|
| Dimethylaniline | 7.1 | 10,000 |
| N—methylaniline | 7.3 | 4,000 |
| Dimethylindole | 7.8 | 40 |
| Tetrathiafulvalene | 6.9 | 3 |
| Tetramethylphenylenediamine | 6.8 | 1.5 |
| PMDA-ODA (control) | — | 1.0 |
| I (control) | — | approx. 0 |
| II (control) | — | approx. 0 |
| III (control) | — | approx. 0 |
| IV (control) | — | approx. 0 |

Photoimaging Methods

In carrying out imaging processes, complexes of this invention can be carried on a support or fabricated in the form of a self-supporting photoconductive layer, grounded, and given a surface electrostatic charge. The charged surface can be given a conventional exposure to actinic radiation to produce an electrostatic latent image. The photoconductive properties of the polyimide-electron donor charge transfer complex cause conductivity to increase in the exposed area to an extent dependent upon the intensity of exposure and initial potential, dissipating surface charge partially or wholly in exposed areas and leaving largely unaffected charge only in unexposed areas. The resulting electrostatic latent image can then be developed by conventional means, for example, using electrostatic toners. The developed image can then be viewed directly or transferred to a receptor such as paper or a polymeric substrate, using an electric field or volatile solvents, or other transfer techniques, for example, as disclosed by Schaffert, *Electrophotography*, (Focal Press, London, 1973). Moreover, the photoconductive polyimide-electron donor charge transfer complex can be used to produce a transparency which can be either a continuous tone or halftone reproduction.

As noted above, the photoconductive polyimide-electron donor charge transfer complexes can be employed in the form of self-supporting films or as coatings on suitable support materials. When soluble polyimides to be treated in accordance with this invention are coated on the surface of a support, the polyimide can be applied in any conventional form, for example, spraying, spin-coating, draw-coating, etc. Polymer is generally applied as a solution in a suitable solvent, allowed to dry, and the resulting coated substrate treated with electron donor compounds as previously described. Alternatively, donor may be added to the polyimide solution prior to coating. Likewise, polyamic acid precursors to polyimides can be handled in a similar manner and then converted to polyimides as previously described.

Whether the treated polyimide is in the form of a self-supporting film or a coating, one side of the photoconductive polyimide layer is preferably in contact with an electrically conductive surface during charging of the photoconductive polymer surface. If the photoconductive polymer is a self-supporting film, the film may be metallized on one side or laminated to a metal foil such as aluminum, silver, copper, nickel, etc. Alternatively, the polymer can be brought into electrically conductive contact with a conducting layer. To insure good contact of photoconductive film with the conducting layer, the film surface in contact with the conducting layer can be wetted with a liquid such as water or a suitable organic solvent, for example, ethanol or acetone.

The electrically conductive surface employed in contact with a photoconductive element of the present invention can be a plate, sheet, or layer having a specific resistivity smaller than that of the photoconductive layer, generally less than $10^9$ ohm-cm, preferably $10^5$ ohm-cm or less. Suitable conductive surfaces include metal sheets, or insulators such as glass, polymer films, or paper, which are coated with conductive coatings or wetted with conductive liquids, or otherwise made conductive.

The surface of photoconductive polyimide-electron donor charge transfer complexes can be charged for image retention according to any conventional technique, for example, corona discharge, contact charge, capacitive discharge, or others. Charging of the free surface of the polyimide-electron donor charge transfer complex component of the photoconductor is preferably carried out in the dark or in subdued illumination. Potential fields applied can range from 10 kV/cm up to the the maximum acceptance potential of the film, preferably 1000 kV/cm and above. These fields are thickness-dependent by definition, and corresponding surface potentials range from about 700 to about 1200 V, either positive or negative relative to ground. Either a negative or positive potential can be applied although a negative potential is preferred when positively-charged developers are to be employed. During charging, the electrically conductive surface of the support or the electrically conductive surface on which the self-supporting treated polyimide is resting should be grounded.

When the charged, photoconductive polyimide-electron donor charge transfer complexes of the present invention are exposed to electromagnetic radiation, the exposed areas are discharged leaving the unexposed areas more highly charged. The resulting electrostatic latent image can then be converted to a visible image according to standard electrophotographic development techniques. Suitable developers or toners include charged aerosols, powders, or liquids containing finely divided, charged substances which are attracted to the charged image areas. Preferably, latent images are developed by contact with a developer consisting of a carrier and a toner, suitable carriers being small glass balls, iron powder, plastic balls, or a low boiling dielectric liquid. Useful toners generally are resin/pigment mixtures having a grain size from 1 to 100 micrometers.

The photoconductive elements of this invention are useful in various processes for electrostatic or xerographic image reproduction. One significant application for such materials is in fabrication of printed circuitry. Printed circuitry can be produced directly on polyimides through xerographic discharge, toning, and embedding conductive material in a thermoplastic toner. Subsequent electroplating or electroless plating can be employed to create conductive layers. In addition, the photoconductive elements provided by the present invention can be employed as photodetectors.

In the following Examples, all parts and percentages are by weight unless otherwise indicated and all degrees reported are Celsius (°C.). The PMDA-ODA employed in the Examples is a product of E. I. du Pont de Nemours and Company, Wilmington, Del., sold under the registered trademark, "Kapton"; and is a commercial grade polyimide available in thicknesses ranging from about 7.6 micrometers to 152 micrometers. Complex formation is indicated by color change as reported.

EXAMPLE 1

This Example illustrates formation of a positive image on a polyimide-electron donor charge transfer complex. In this Example, a complex of PMDA-ODA and N.N-dimethylaniline in film form was prepared and exposed through a transparency, resulting in photoinduced discharge. Following application of a toner to the exposed sample, a high-quality electrostatic image was formed.

A 5×5 cm square of PMDA-ODA film, 7.6 microns in thickness, was immersed in 50 mL of a solution containing 5M N,N-dimethylaniline in methylene chloride, in a closed container. The sample was treated in this solution for 48 hours, then withdrawn from the solution and rinsed four times with methanol. The film was then air-dried for about one hour prior to use. The color of the film had changed from its original yellow tint to light brown indicating complex formation.

One side of the resulting treated film was then painted with a silver-containing spray paint. The painted surface was fixed to a ground plate, and the grounded plate, with treated film attached, was then passed slowly under a 2 mil tungsten corona wire charged to −8 kV relative to ground, using a Monroe Electronics high voltage corona discharge device. The film was charged to a potential field of 800 kV/cm, or 600 V surface potential.

A transparency was then placed over the charged film surface and irradiated for 0.5 second using a 50 W high intensity lamp (Roxter Corp.) at a distance of 10 cm from the film surface, forming an electrostatic latent image. The resulting imaged film was then sprinkled with a resin-based commercial toner (Kodak ®) suitable for use on negatively charged surfaces and excess toner removed by a gentle air stream. The toned image was fixed to the film surface by heating the film for about 2 minutes at 80° on a hot plate.

EXAMPLE 2

This Example illustrates direct measurement of photoconductivity induced in PMDA-ODA film treated with N,N-dimethylaniline.

A sample of PMDA-ODA film was treated with N,N-dimethylaniline substantially as described in Example 1. After drying, silver contacts were painted onto one side of the polymer film and the film placed between a front electrode of tin oxide coated conductive glass and a back electrode of copper metal. The silver-painted surface of the film sample was placed in contact with the copper electrode. The front electrode was then connected to a high voltage power supply (Fluke Instruments) and the back electrode connected to ground through a picoammeter (Keithley Model 616). The resulting assemb)y was placed in a brass box fitted with a quartz window, which was charged with nitrogen. A field of 700 kV/cm was then applied to the sample.

Illumination of the sample through the transparent conductive glass electrode, using a calibrated visible illumination source, permitted quantification of induced photocurrent. Current enhancement in the complex exceeded that measured for non-treated PMDA-ODA film by a factor of about $10^4$.

EXAMPLE 3

This Example illustrates formation of a negative image using N,N-dimethylaniline-treated PMDA-ODA film.

A film sample was prepared for exposure substantially as described in Example 1. Following charging to +600 V, the film was exposed to light from a high-intensity lamp through a transparency, and toner applied as described in Example 1. A negative image formed on the exposed, treated film.

EXAMPLE 4

This Example illustrates preparation and N,N-dimethylaniline treatment of a spin-coated polyimide film suitable for electrostatic imaging.

A polyimide film was prepared from commercial polyamic acid derived from the condensation of pyromellitic dianhydride with oxydianiline, as described in U.S. Pat. No. 3,179,634. A 17 per cent solution of polyamic acid in dimethylacetamide was spin-coated onto a tin oxide coated glass plate at 1000 rpm. The resulting colorless film adhering to the plate was then heated to 80° for 10 minutes. After cooling to about 23°, the plate was immersed in a 1:1 solution of acetic anhydride and pyridine for 2 hours. After removal from this bath, the plate, now bearing a yellow film, was washed repeatedly with methanol and air-dried. The plate was then immersed in a 5M solution of N,N-dimethylaniline in methylene chloride for 3 hours, yielding a reddish-brown film. This film was imaged as described in Example 1.

EXAMPLE 5

This Example illustrates transfer of an electrostatic image formed on N,N-dimethylaniline-treated polyimide.

A sample of PMDA-ODA polyimide film was treated with N,N-dimethylaniline, charged, and exposed as described in Example 1, above. After formation of a latent image, the resulting image was transferred to a sheet of white bond paper by applying toner to the exposed film surface, contacting the paper sheet to the toner-covered surface, and passing the film-paper combination under a corona wire charged to 8 kV. A reverse-reading high resolution image was formed on the paper.

EXAMPLE 6

This Example illustrates formation of conductive lines in the image of a circuit element using PMDA-ODA complexed with N,N-dimethylaniline.

A sample of PMDA-ODA film was treated with N,N-dimethylaniline, charged, and exposed as described in Example 1, above. However, a transparency representing a printed circuit board was employed during the exposure step. After toning the image as described in Example 1, the toner was melted at 80° and dusted with a fine silver powder. The silver powder was fixed to the melted toner resin by placing the heated film under pressure; excess silver was removed using an air stream. The toned lines were determined to be conductive.

EXAMPLE 7

This Example illustrates direct measurement of photoconductivity induced in PMDA-ODA film treated with 2,3-dimethylindole.

The sample was prepared substantially as described in Example 2, but in this case the film was treated with a solution 5M 2,3-dimethylindole. Measurement of photoconductivity was conducted as described in Example 2, using 620 nm monochromatic radiation. Photoconductivity was enhanced about 30-fold relative to untreated PMDA-ODA film

EXAMPLE 8

This Example illustrates direct measurement of photoconductivity induced in PMDA-ODA film treated with tetrathiafulvalene.

The sample was prepared substantially as described in Example 2, but in this case the film was treated with 5M tetrathiafulvalene. Measurement of photoconductivity was conducted as described in Example 2, using 620 nm monochromatic radiation. Photoconductivity was enhanced about 10-fold relative to untreated PMDA-ODA film.

EXAMPLE 9

This Example illustrates direct measurement of photoconductivity induced in PMDA-ODA film treated with N-methylaniline.

The sample was prepared substantially as described in Example 2, but in this case the film was treated with a solution of 5M N-methylaniline. Measuremnt of photoconductivity was conducted as described in Example 2, using 620 nm monochromatic radiation. Photoconductivity was enhanced about 1000-fold relative to untreated PMDA-ODA film.

EXAMPLE 10

This Example illustrates direct measurement of photoconductivity induced in PMDA-ODA film treated with N,N,N',N'-tetramethyl-1,4-phenylenediamine.

The sample was prepared substantially as described in Example 2, but in this case the film was treated with a solution of 5M N,N,N',N'-tetramethyl-1,4-phenylenediamine. Measurement of photoconductivity was conducted as described in Example 2, using 620 nm monochromatic radiation. Photoconductivity was enhanced about 4-fold relative to untreated PMDA-ODA film.

The embodiments of the invention in which an exclusive property or privilege is claimed are defined as follows:

1. A photoconductive element comprising a polyimide-electron donor charge transfer complex, the electron donor having an ionization potential of 6 to 9 electron volts and no photoconductivity in the visible light region, the element characterized in that it:
   (i) is photoconductive in the visible light region, and
   (ii) has photoconductivity in excess of the sum of the photoconductivities of the polyimide and donor, individually.

2. A photoconductive element according to claim 1, wherein the electron donor compound is selected from the group consisting of analine and substituted anilines of the formula

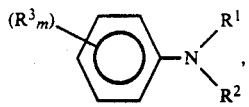

wherein $R^1$, $R^2$, $R^3$, and m are as defined in claim 1.

3. A photoconductive element according to claim 2, wherein $R^1$ and $R^2$ are each hydrogen, methyl, or ethyl, and $R^3$ is hydrogen.

4. A photoconductive element according to claim 3, wherein the electron donor compound is N,N-dimethylaniline or N-methylaniline.

5. A photoconductive element according to claim 4, wherein the electron donor compound is N,N-dimethylaniline.

6. A photoconductive element according to claim 1, wherein the electron donor compound is selected from the group consisting of tetrathiafulvalene and derivatives of the formula

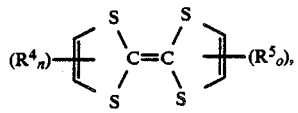

wherein $R^4$, $R^5$, n and o are as defined in claim 1.

7. A photoconductive element according to claim 6, wherein the electron donor compound is tetrathiafulvalene.

8. A photoconductive element according to claim 1, wherein the electron donor compound is selected from the group consisting of 2,3-substituted indole compounds of the formula

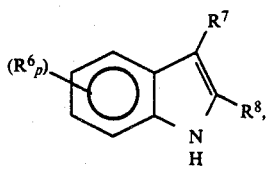

wherein $R^6$, $R^7$, $R^8$ and p are as defined in claim 1.

9. A photoconductive element according to claim 8, wherein $R^6$ and $R^7$ are independently hydrogen or methyl, and $R^8$ is hydrogen.

10. A photoconductive element according to claim 9, wherein the electron donor compound is 2,3-dimethylindole.

11. A photoconductive element according to claim 1, wherein the electron donor compound is selected from the group consisting of substituted phenylenediamine compounds of the formula

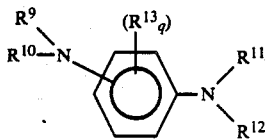

wherein $R^9$, $R^{10}$, $R^{11}$, $R^{12}$, $R^{13}$, and q are as defined in claim 1.

12. A photoconductive element according to claim 11, wherein $R^9$, $R^{10}$, $R^{11}$, and $R^{12}$ are independently hydrogen, methyl, or ethyl, and $R^{13}$ is hydrogen.

13. A photoconductive element according to claim 12, wherein the electron donor compound is N,N,N',N'-tetramethyl-1,4-phenylenediamine.

14. A photoconductive element according to claim 1, wherein the concentration of the donor in the complex is about 0.1 to 50 weight percent.

15. A photoconductive element according to claim 14 wherein the concentration of the donor is about 1 to 10 weight percent.

16. A process for image reproduction, comprising applying a surface eletrostatic charge to a photoconductive element of claim 1, imagewise exposing said charged element to a source of electromagnetic radiation to form an electrostatic latent image, and developing the latent image.

17. A process for image reproduction, comprising applying a surface electrostatic charge to a photoconductive element of claim 1, imagewise exposing said charged element to a source of electromagnetic radiation to form an electrostatic latent image, and developing the latent image.

18. A process for image reproduction, comprising applying a surface electrostatic charge to a photoconductive element of claim 1 imagewise exposing said charged element to a source of electromagnetic radiation to form an electrostatic latent image, and developing the latent image.

19. A process for image reproduction, comprising applying a surface electrostatic charge to a photoconductive element of claim 2, imagewise exposing said charged element to a source of electromagnetic radiation to form an electrostatic latent image, and developing the latent image.

20. A process for image reproduction, comprising applying a surface electrostatic charge to a photoconductive element of claim 8, imagewise exposing said charged element to a source of electromagnetic radiation to form an electrostatic latent image, and developing the latent image.

21. A process for fabricating printed circuitry, comprising applying a surface electrostatic charge to a photoconductive element of claim 1, imagewise exposing said charged element to a source of electromagnetic radiation to form an electrostatic latent image, and developing the latent image to form a conductive layer.

22. A process for photodetection employing the photoconductive element of claim 1 as photodetector, comprising the steps:
(i) applying an electrical potential across the thickness of the photodetector in which said element is sandwiched between an electrode transparent to radiation at a wavelength at which the element exhibits absorption, and an electrode connected to ground through a current measuring device;
(ii) illuminating the photodetector; and
(iii) determining illumination intensity from the current measuring device.

* * * * *

UNITED STATES PATENT AND TRADEMARK OFFICE
CERTIFICATE OF CORRECTION

PATENT NO. : 4,728,593
DATED : March 1, 1988
INVENTOR(S) : Steven C. Freilich; Stephen Mazur It is certified that error appears in the above-identified patent and that said Letters Patent is hereby corrected as shown below:

Cancel Claim 1 at Column 10, lines 55 to 64 and replace with:

--1. A photoconductive element comprising a polyimide-electron donor charge transfer complex, the electron donor having an ionization potential of about 6.7 to 7.8 electron volts and no photoconductivity in the visible light region, the element characterized in that it:
    (i)  is photoconductive in the visible light region, and
    (ii) has photoconductivity in excess of the sum of the photoconductivities of the polyimide and donor, individually,
wherein the polyimide is a condensation product of pyromellitic dianhydride and oxydianiline (bis(4-aminophenyl)ether), and the electron donor is selected from at least one member of the group:
    I.  aniline and substituted anilines of the formula

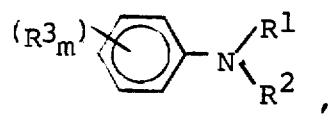

II. tetrathiafulvalene and derivatives of the formula

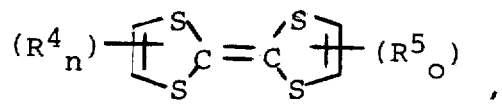

UNITED STATES PATENT AND TRADEMARK OFFICE
CERTIFICATE OF CORRECTION

PATENT NO. : 4,728,593

DATED : March 1, 1988

INVENTOR(S) : Steven C. Freilich; Stephen Mazur

It is certified that error appears in the above-identified patent and that said Letters Patent is hereby corrected as shown below:

III. 2,3-substituted indole compounds of the formula

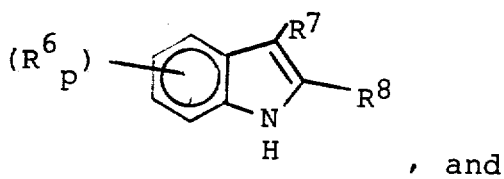

, and

IV. substituted phenylenediamine compounds of the formula

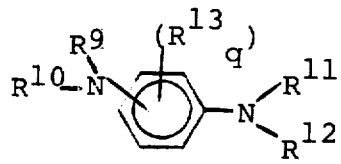

wherein $R^1$ through $R^{13}$ are independently selected from the group consisting of hydrogen, $C_1$ to $C_{20}$ alkyl, $C_1$-$C_{20}$ alkoxy, $C_6$ to $C_{12}$ aryl, or $C_7$ to $C_{15}$ alkaryl or aralkyl;

UNITED STATES PATENT AND TRADEMARK OFFICE
CERTIFICATE OF CORRECTION

PATENT NO. : 4,728,593

DATED : March 1, 1988

INVENTOR(S) : Steven C. Freilich; Stephen Mazur

Page 3 of 3

It is certified that error appears in the above-identified patent and that said Letters Patent is hereby corrected as shown below:

$m$ is an integer from 1 to 5;
    $n$ and $o$ are 1 or 2;
    $p$ is an integer from 1 to 4; and
    $q$ is an integer from 1 to 4.--

Signed and Sealed this

Twentieth Day of September, 1988

Attest:

DONALD J. QUIGG

Attesting Officer

Commissioner of Patents and Trademarks